US009716167B2

(12) United States Patent
Leng et al.

(10) Patent No.: US 9,716,167 B2
(45) Date of Patent: Jul. 25, 2017

(54) TRENCH DMOS TRANSISTOR WITH REDUCED GATE-TO-DRAIN CAPACITANCE

(75) Inventors: Yaojian Leng, Scarborough, ME (US); Richard Wendell Foote, Jr., Burleson, TX (US); Steven J. Adler, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 231 days.

(21) Appl. No.: 13/032,405

(22) Filed: Feb. 22, 2011

(65) Prior Publication Data

US 2012/0211826 A1  Aug. 23, 2012

(51) Int. Cl.
*H01L 29/66* (2006.01)
*H01L 29/78* (2006.01)
*H01L 29/06* (2006.01)
H01L 29/423 (2006.01)

(52) U.S. Cl.
CPC ...... *H01L 29/7813* (2013.01); *H01L 29/0623* (2013.01); *H01L 29/66734* (2013.01); *H01L 29/7809* (2013.01); H01L 29/42368 (2013.01)

(58) Field of Classification Search
CPC ............. H01L 29/1095; H01L 29/4236; H01L 29/7813
USPC .......... 257/288, 312, 314, 328, 330, E21.14, 257/E29.262; 438/197, 270
See application file for complete search history.

(56) References Cited

U.S. PATENT DOCUMENTS

| 6,426,520 | B1* | 7/2002 | Traijkovic | .......... H01L 29/0619 257/107 |
| 7,638,841 | B2* | 12/2009 | Challa | ................. H01L 21/3065 257/331 |
| 2002/0079535 | A1* | 6/2002 | Tihanyi et al. | ................ 257/329 |
| 2004/0021173 | A1* | 2/2004 | Sapp | ............................ 257/330 |
| 2010/0213505 | A1* | 8/2010 | Hirler | ................. H01L 27/0727 257/139 |

OTHER PUBLICATIONS

Cheng, X. et al., "Performance Analysis of Trench Power MOSFETs in Synchronous Buck Converter Applications", Twenty Second Annual IEEE Applied Power Electronics Conference, APEC 2007, pp. 332-338.
Xiong, Yali et al., "Performance Analysis of Trench Power MOSFETs in High-Frequency Synchronous Buck Converter Applications", International Journal of Power Management Electronics, vol. 2008, Issue 1, 2008, pp. 1-9.
Darwish, Mohamed et al., "A New Power W-Gated Trench MOSFET (WMOSFET) with High Switching Performance", Proceedings of 2003 IEEE 15th International Symposium on Power Semiconductor Devices and ICs, 2003, pp. 24-27.
Darwish, Mohamed, "W-Gated Trench MOSFET Offers Efficient DC-DC Converters", Power Electronics Technology, 2003, pp. 38-40.

(Continued)

*Primary Examiner* — Marvin Payen
*Assistant Examiner* — Vernon P Webb
(74) *Attorney, Agent, or Firm* — Jacqueline J. Garner; Charles A. Brill; Frank D. Cimino

(57) ABSTRACT

A trench DMOS transistor with a very low on-state drain-to-source resistance and a high gate-to-drain charge includes one or more floating islands that lie between the gate and drain to reduce the charge coupling between the gate and drain, and effectively lower the gate-to-drain capacitance.

15 Claims, 20 Drawing Sheets

(56) References Cited

OTHER PUBLICATIONS

Darwish, Mohamed, "Next-Generation Semiconductors for DC-DC Converters", Proceedings of Bipolar/BiCMOS Circuits and Technology Meeting, 2003, pp. 15-21.
Darwish, M. et al., "W-gated trench power MOSFET (WFET)", IEE Proceedings of Circuits, Devices and Systems, vol. 151, Issue 3, 2004, pp. 238-242.

* cited by examiner

TRENCH DMOS TRANSISTOR WITH REDUCED GATE-TO-DRAIN CAPACITANCE

BACKGROUND OF THE INVENTION

1. Field of the Invention

The present invention relates to trench DMOS transistors and, more particularly, to a trench DMOS transistor with reduced gate-to-drain capacitance.

2. Description of the Related Art

A metal-oxide-semiconductor (MOS) transistor is a well-known device that has spaced-apart source and drain semiconductor regions which are separated by a channel semiconductor region of the opposite conductive type. The MOS transistor also has an oxide layer that lies over the channel semiconductor region, and a metal gate that touches the oxide layer and lies over the channel semiconductor region. In addition to metal, the gate of a MOS transistor is also commonly formed with doped polysilicon.

A double-diffused MOS (DMOS) transistor is a power transistor that has a large lightly-doped drain semiconductor region that touches the channel semiconductor region. A trench DMOS transistor, in turn, is a type of DMOS transistor where the spaced-apart source and drain semiconductor regions of the transistor are vertically aligned.

Trench DMOS transistors can be characterized by a figure of merit (FOM), which is equal to the product of the on-state drain-to-source resistance $r_{DS(ON)}$ and the gate-to-drain charge $Q_{GD}$. For a technology with a given FOM, the on-state drain-to-source resistance $r_{DS(ON)}$ can be reduced by increasing the chip size (area).

Increasing the chip size (area), however, also increases the gate-to-drain capacitance $C_{GD}$ which, in turn, causes the gate-to-drain charge $Q_{GD}$ to increase. The increase in the gate-to-drain charge $Q_{GD}$ offsets the decrease in the on-state drain-to-source resistance $r_{DS(ON)}$ so that the given FOM value remains unchanged.

This represents a trade off scenario for the on-state drain-to-source resistance $r_{DS(ON)}$ and the gate-to-drain charge $Q_{GD}$. The FOM can only be improved (smaller in value) if the on-state drain-to-source resistance $r_{DS(ON)}$ can be reduced without increasing the gate-to-drain charge $Q_{GD}$, or if the gate-to-drain charge $Q_{GD}$ can be reduced without increasing the on-state drain-to-source resistance $r_{DS(ON)}$.

The gate-to-drain charge $Q_{GD}$ is usually a dominant portion of the switching charge, and directly impacts the efficiency of a DC-DC converter. The gate-to-drain capacitance $C_{GD}$, which is a non-linear function of the voltage, is commonly known as the Miller capacitance because the gate-to-drain capacitance $C_{GD}$ causes the total dynamic input capacitance of the DMOS transistor to be larger than the total static input capacitance of the DMOS transistor.

In switching applications, the gate-to-drain capacitance $C_{GD}$ limits the maximum switching frequency of the DMOS transistor (i.e., limits how quickly the DMOS transistor can be repeatedly turned on and off). Thus, as the on-state drain-to-source resistance $r_{DS(ON)}$ falls, the gate-to-drain capacitance $C_{GD}$ rises, the gate-to-drain charge $Q_{GD}$ rises, and the maximum switching frequency of the DMOS transistor undesirably falls. Thus, there is a need for a trench DMOS transistor that has both a low on-state drain-to-source resistance $r_{DS(ON)}$ and a low gate-to-drain capacitance $C_{GD}$.

DETAILED DESCRIPTION OF THE INVENTION

Figure 1:
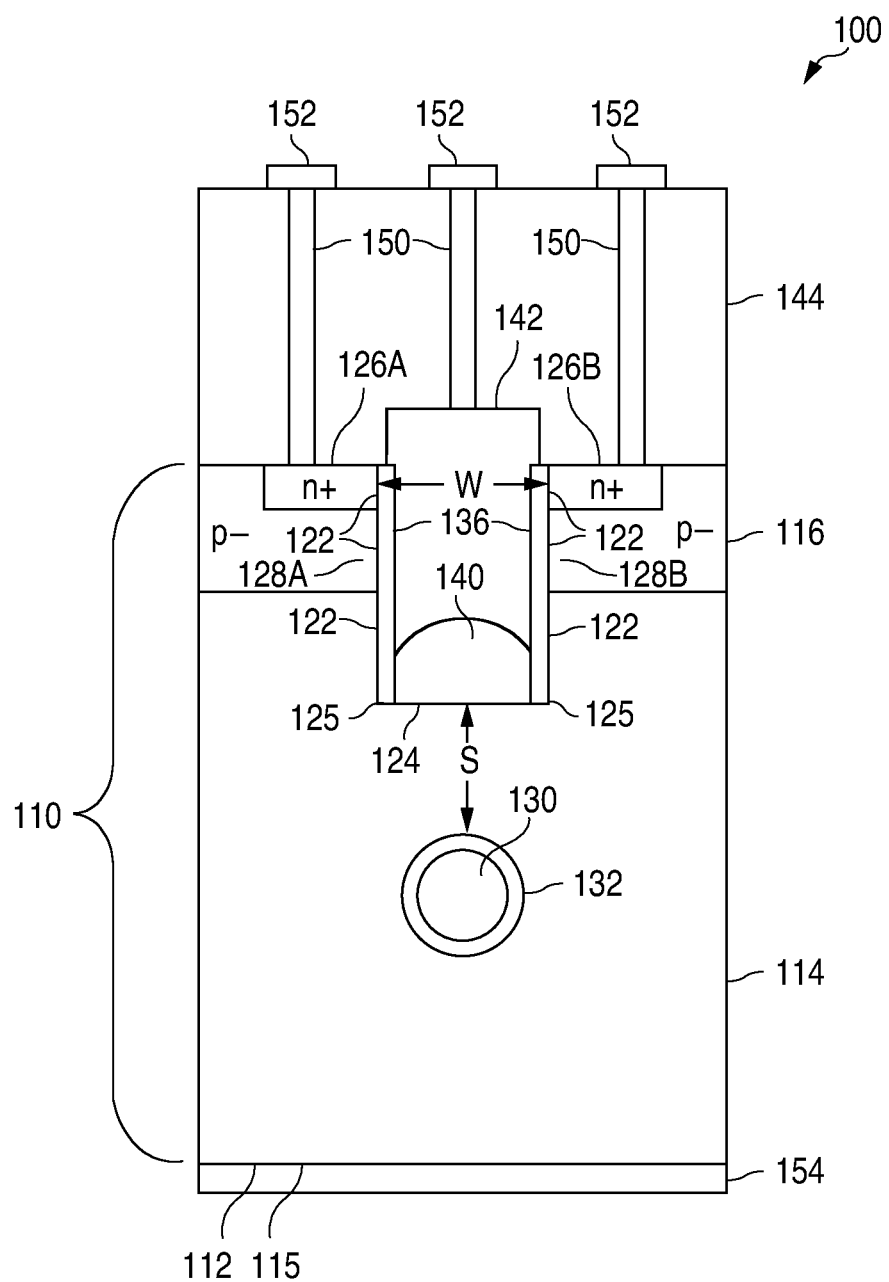
FIG. 1 is a cross-sectional diagram illustrating a trench DMOS transistor 100 in accordance with the present invention.

FIG. 1 shows a cross-sectional diagram that illustrates a trench DMOS transistor 100 in accordance with the present invention. As described in greater detail below, trench DMOS transistor 100 reduces the gate-to-drain (Miller) capacitance $C_{GD}$ by utilizing one or more floating islands that lie between the bottom of the trench and the bottom of the drain region.

As shown in FIG. 1, trench DMOS transistor 100 includes a semiconductor structure 110, such as a substrate or an epitaxial layer. Semiconductor structure 110, in turn, has a bottom surface 112, a drain region 114 with a bottom surface 115 that touches bottom surface 112, and a body region 116 that touches and lies above drain region 114. In the present example, drain region 114 is n-type and body region 116 is p-type.

Semiconductor structure 110 also includes an opening 122 that extends through body region 116 into drain region 114. Opening 122 has a bottom surface 124 and a bottom corner 125. In addition, semiconductor structure 110 includes source regions 126A and 126B that touch body region 116. In the present example, the source regions 126A and 126B are n-type and heavily doped (e.g., n+).

Depending on the trench DMOS architecture that is utilized, the source regions 126A and 126B can be spaced apart or touch each other as a single region. As shown, drain region 114 and the source regions 126A and 126B are vertically spaced apart and separated by channel regions 128A and 128B, respectively, of body region 116.

In accordance with the present invention, semiconductor structure 110 also includes an island 130 of opposite conductivity type that is formed within drain region 114. Further, semiconductor structure 110 includes a depletion (space charge) region 132 that touches and completely surrounds island 130. In addition, drain region 114 touches and completely surrounds depletion region 132. Thus, drain region 114 also completely surrounds island 130. The size of depletion region 132 depends on the relative doping concentrations as well as the voltage applied to drain region 114.

In the present example, island 130 is p-type. Further, island 130, which is vertically aligned with opening 122, lies between and spaced apart from the bottom surface 112 of semiconductor structure 110 and the bottom surface 124 of opening 122. In addition, a shortest separation distance S lies between the upper edge of depletion region 132 and the bottom surface 124 of opening 122.

As further shown in FIG. 1, trench DMOS transistor 100 also includes a gate oxide layer 136 that touches drain region 114 and body region 116 to line the side walls of opening 122. Trench DMOS transistor 100 additionally includes an insulation region 140 that touches the bottom surface 124 of opening 122. Further, trench DMOS transistor 100 also includes a gate 142 that touches gate oxide layer 136 and insulation region 140. Gate 142, which is conductive, lies within opening 122 and fills the remainder of opening 122. As shown, island 130 lies vertically between gate 142 and the bottom surface 112 of semiconductor structure 110.

In addition, trench DMOS transistor 100 also includes an isolation structure 144 that touches the top surface of body region 116, a number of metal contacts 150 that extend through isolation structure 144, a number of metal-1 lines 152, and a metal contact 154 that touches drain region 114. One of the metal contacts 150 makes an electrical connection with gate 142, while other metal contacts 150 make electrical connections with the source regions 126A and 126B and body region 116 (contacts to body region 116 not shown).

In operation, a first positive voltage is placed on drain region 114 and a second positive voltage is placed on gate 142, while ground is placed on body region 116 and the source regions 126A and 126B. Island 130, in turn, electrically floats and is not directly connected to a voltage source. In response to these bias conditions, the channel regions 128A and 128B of body region 116 invert, and electrons flow from the source regions 126A and 126B to drain region 114.

In accordance with the present invention, the placement of island 130 vertically between gate 142 and drain region 114 partially screens the charge on gate 142 from drain region 114 due to the depletion region 132 surrounding island 130, effectively reducing the gate-to-drain (Miller) capacitance $C_{GD}$. Reducing gate-to-drain capacitance $C_{GD}$, in turn, increases the maximum switching frequency of trench DMOS transistor 100.

Thus, one of the advantages of the present invention is that the present invention provides a trench DMOS transistor that has both a very low on-state drain-to-source resistance $r_{DS(ON)}$ and a very high switching frequency because island 130 effectively reduces the very high gate-to-drain capacitance $C_{GD}$ that is normally associated with a very low on-state drain-to-source resistance $r_{DS(ON)}$.

Another advantage of the present invention is that the present invention can also reduce the break down voltage BVdss of trench DMOS transistor 100. As shown in FIG. 1, by positioning island 130 so that the maximum vertical separation S between the bottom surface 124 of opening 122 and the upper edge of depletion region 132 of island 130 is less than the critical dimension (CD) of opening 122 (in other words, is less than the maximum width W of opening 122, typically 0.1 um to 1 um), the addition of the p-n junction from island 130 reduces the electric field near the bottom corner 125 of opening 122 (where the electric field is the highest), thereby allowing a higher break down voltage BVdss.

The positioning of island 130 reflects the trade off between the gate-to-drain (Miller) capacitance $C_{GD}$, the on-state source-to-drain resistance $r_{DS(ON)}$, and the breakdown voltage BVdss. For example, moving island 130 closer to gate 142 further reduces the gate-to-drain (Miller) capacitance $C_{GD}$ due to the increased charge screening, while at the same time desirably increasing the breakdown voltage BVdss, but undesirably increasing the on-state source-to-drain resistance $r_{DS(ON)}$ due to the restriction of electron flow.

Figure 2:
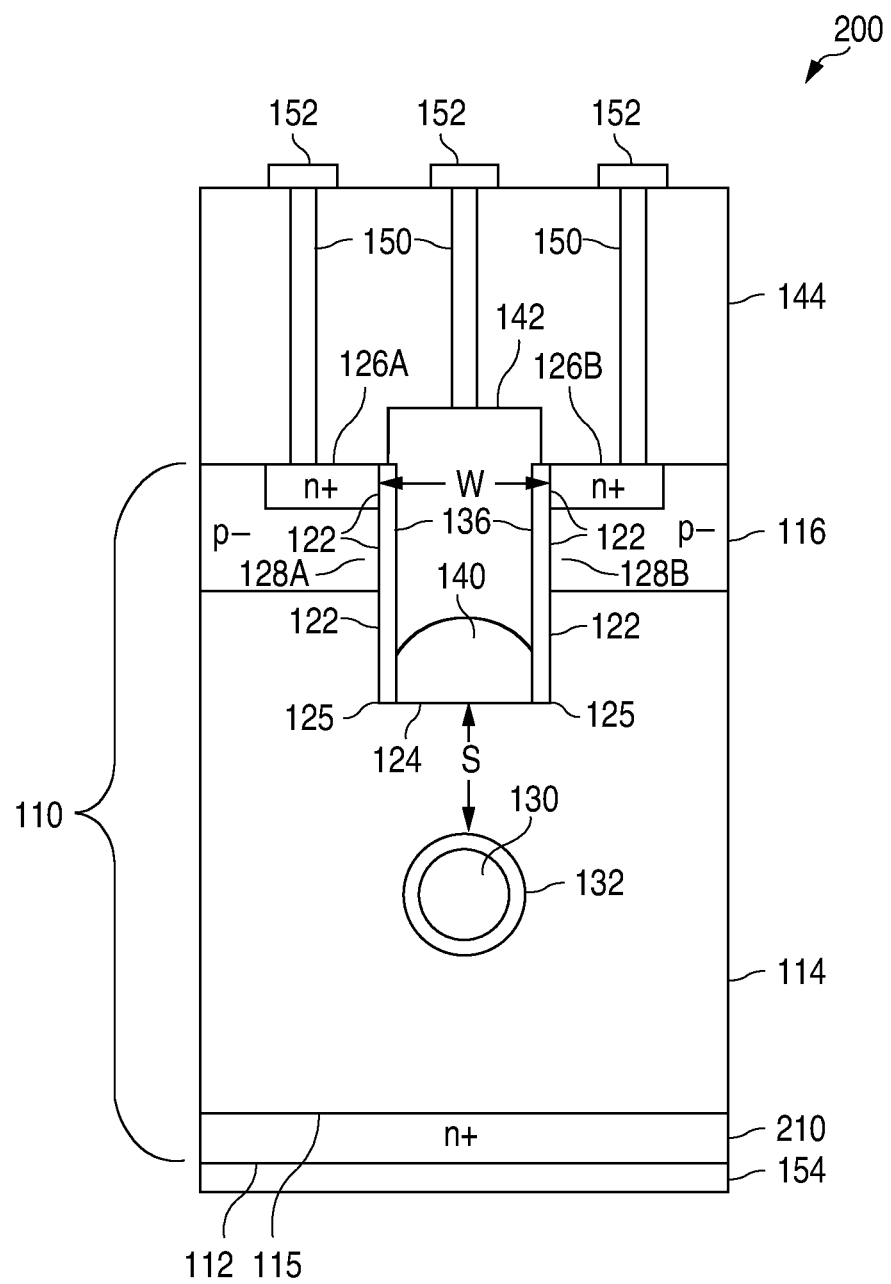
FIG. 2 is a cross-sectional view illustrating an example of a trench DMOS transistor 200 in accordance with an alternate embodiment of the present invention.

FIG. 2 shows a cross-sectional view that illustrates an example of a trench DMOS transistor 200 in accordance with an alternate embodiment of the present invention. Transistor 200 is similar to transistor 100 and, as a result, utilizes the same reference numerals to designate the structures which are common to both transistors.

As shown in FIG. 2, trench DMOS transistor 200 differs from trench DMOS transistor 100 in that trench DMOS transistor 200 includes a contact region 210 of semiconductor structure 110 that touches and lies between the bottom surface 112 of semiconductor structure 110 and the bottom surface 115 of drain region 114. In the present example, contact region 210 is n-type and heavily doped (e.g., n+). Contact region 210 reduces the contact resistance of drain region 114.

Figure 3:
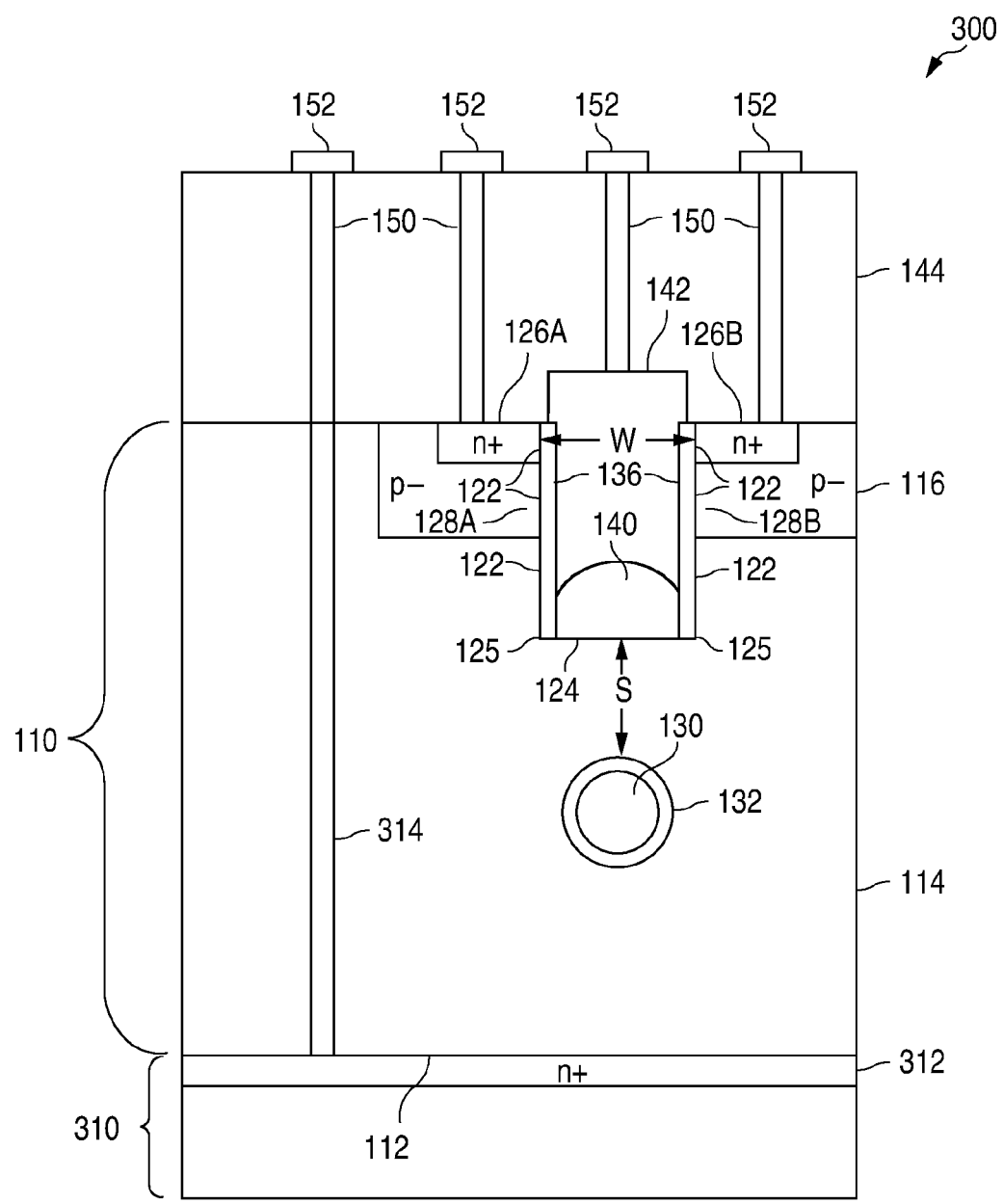
FIG. 3 is a cross-sectional view illustrating an example of a trench DMOS transistor 300 in accordance with an alternate embodiment of the present invention.

FIG. 3 shows a cross-sectional view that illustrates an example of a trench DMOS transistor 300 in accordance with an alternate embodiment of the present invention. Transistor 300 is similar to transistor 100 and, as a result, utilizes the same reference numerals to designate the structures which are common to both transistors.

As shown in FIG. 3, trench DMOS transistor 300 differs from trench DMOS transistor 100 in that trench DMOS transistor 300 includes, in lieu of metal contact 154, a carrier substrate 310, and a buried layer 312 that is formed in the top surface of carrier substrate 310 and connected to the bottom surface 112 of semiconductor structure 110. In the present example, buried layer 312 is n-type and heavily doped (e.g., n+), and semiconductor structure 110 is formed as an epitaxial layer.

As further shown in FIG. 3, trench DMOS transistor 300 also includes a sinker region 314 that extends down from the top surface of semiconductor structure 110 to buried layer 312 in the same manner that the collector sinker of a bipolar transistor extends down to the buried layer of the bipolar transistor. In the present example, sinker region 314 is n-type and heavily doped (e.g., n+). In addition, one of the metal contacts 150 makes an electrical connection to sinker region 314. Thus, as shown in FIGS. 1-3, the present invention applies to trench DMOS transistors that have a number of different drain structures.

Figure 4:
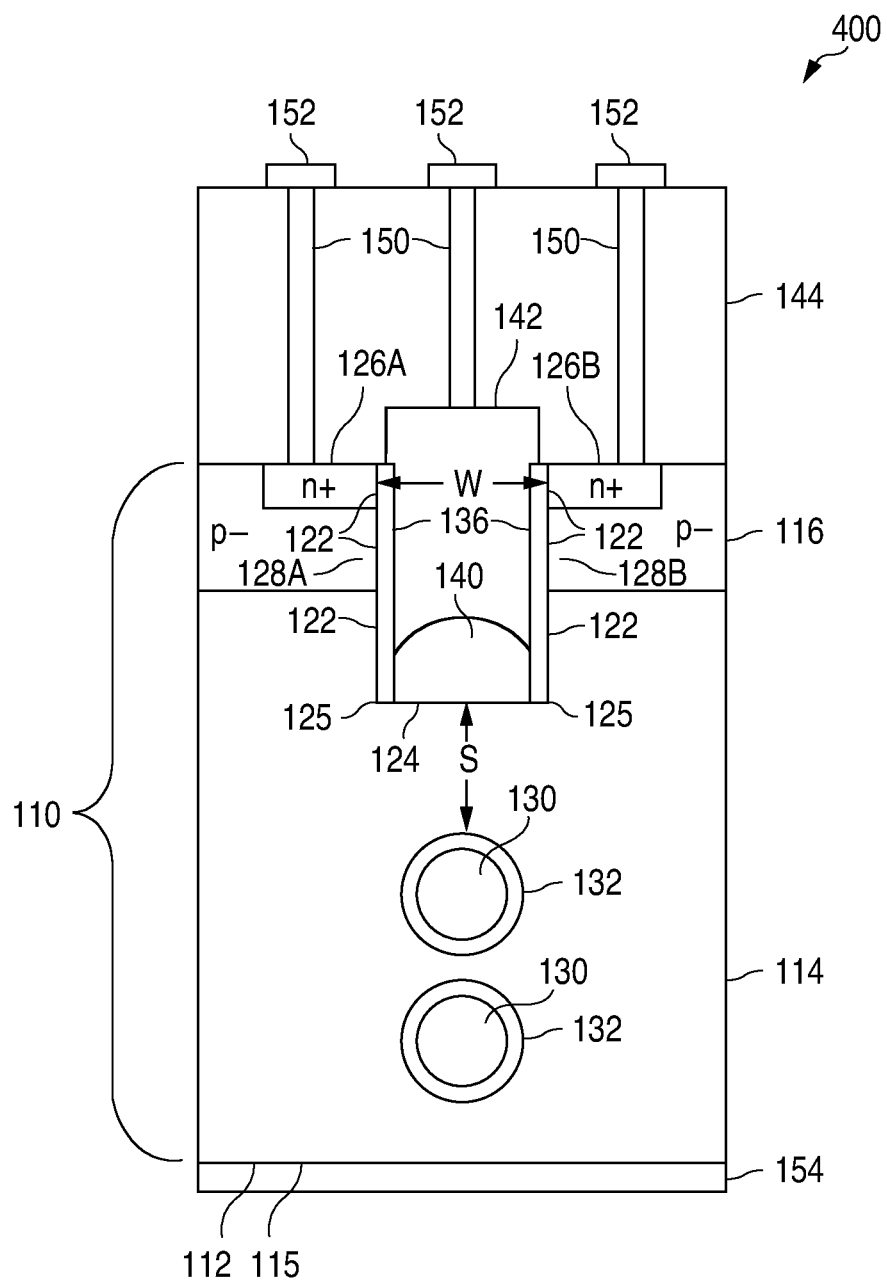
FIG. 4 is a cross-sectional view illustrating an example of a trench DMOS transistor 400 in accordance with an alternate embodiment of the present invention.

FIG. 4 shows a cross-sectional view that illustrates an example of a trench DMOS transistor 400 in accordance with an alternate embodiment of the present invention. Transistor 400 is similar to transistor 100 and, as a result, utilizes the same reference numerals to designate the structures which are common to both transistors.

As shown in FIG. 4, trench DMOS transistor 400 differs from trench DMOS transistor 100 in that trench DMOS transistor 400 includes a number of spaced-apart, vertically-aligned islands 130. In the FIG. 4 example, transistor 400 has a top island 130 and a bottom island 130. The top island 130 lies between and spaced apart from the bottom surface 112 of semiconductor structure 110 and the bottom surface 124 of opening 122.

The bottom island 130 lies between and spaced apart from the top island 130 and the bottom surface 112 of semiconductor structure 110 so that the depletion regions 132 of the islands 130 are spaced apart. Thus, the top and bottom islands 130 are vertically aligned. The use of multiple vertically aligned islands 130 further reduces the gate-to-drain (Miller) capacitance $C_{GD}$ due to the increased charge screening.

Figure 5A:
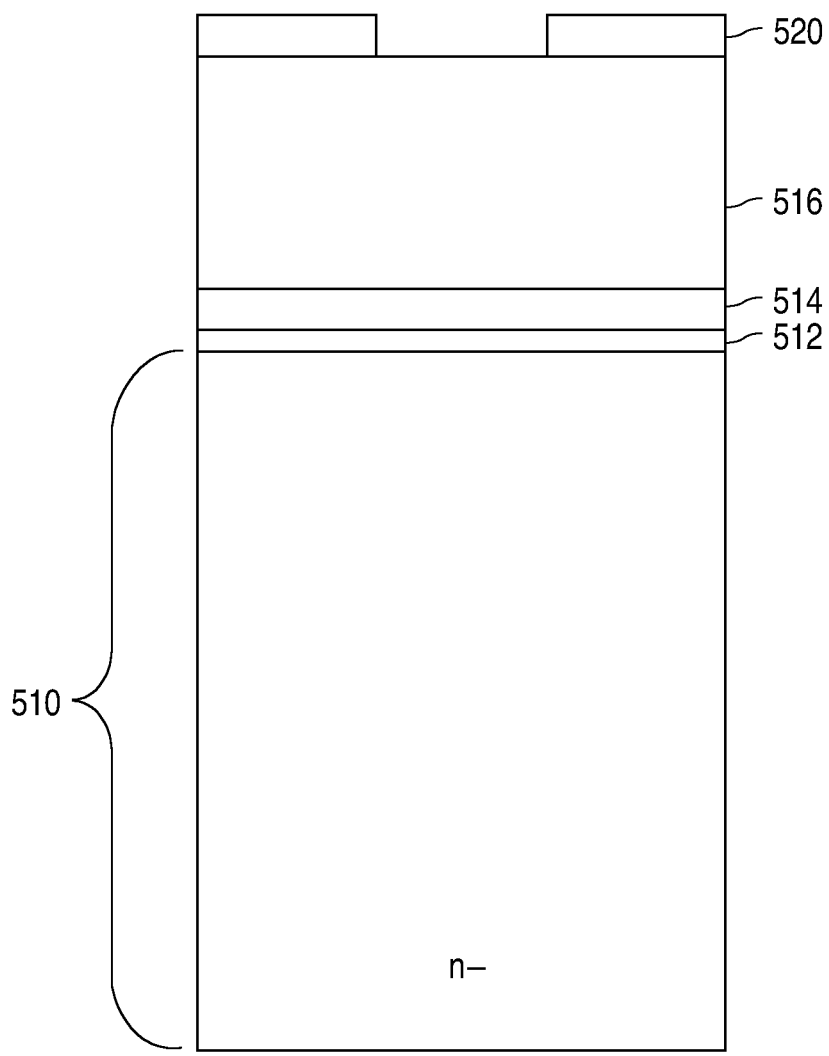
FIGS. 5A-5P are cross-sectional views illustrating an example of a method of forming a trench DMOS transistor in accordance with the present invention.
Figure 5B:
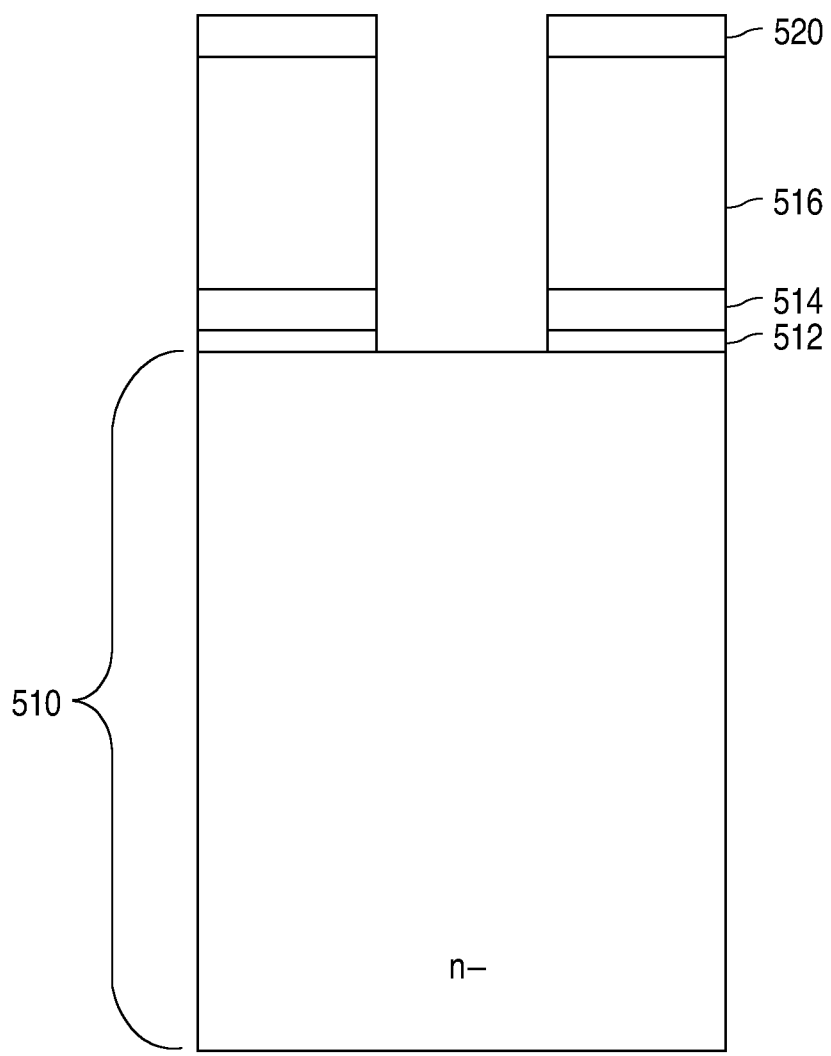
Figure 5C:
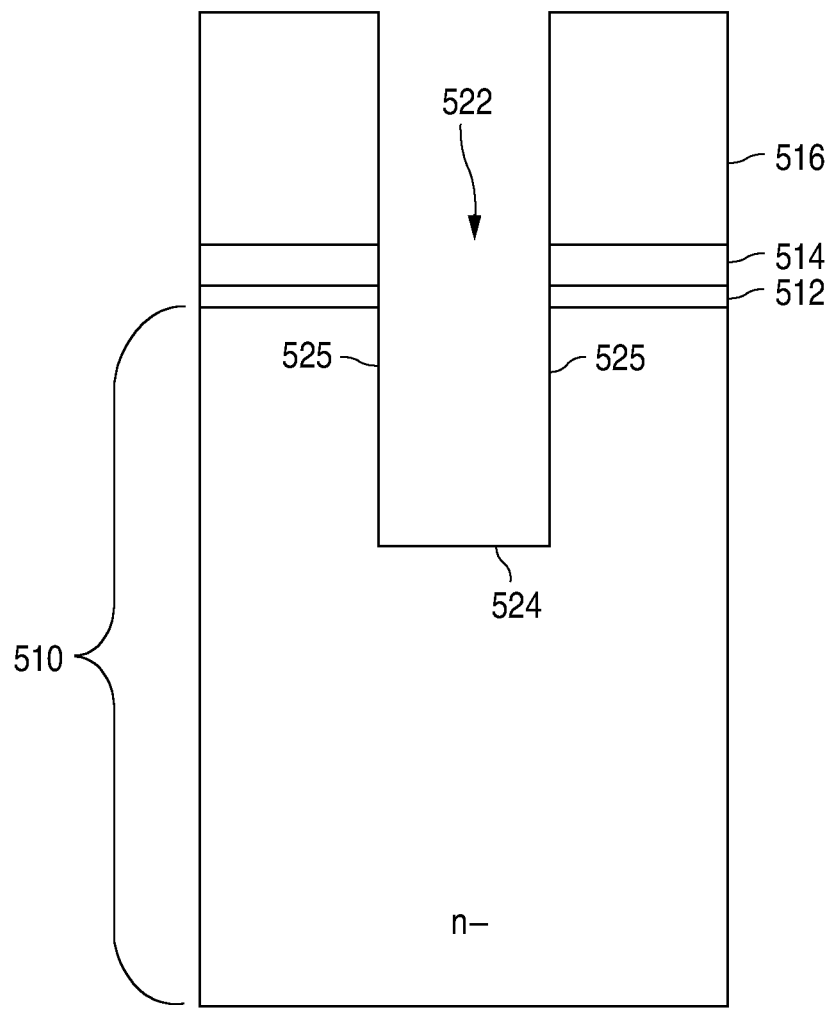
Figure 5D:
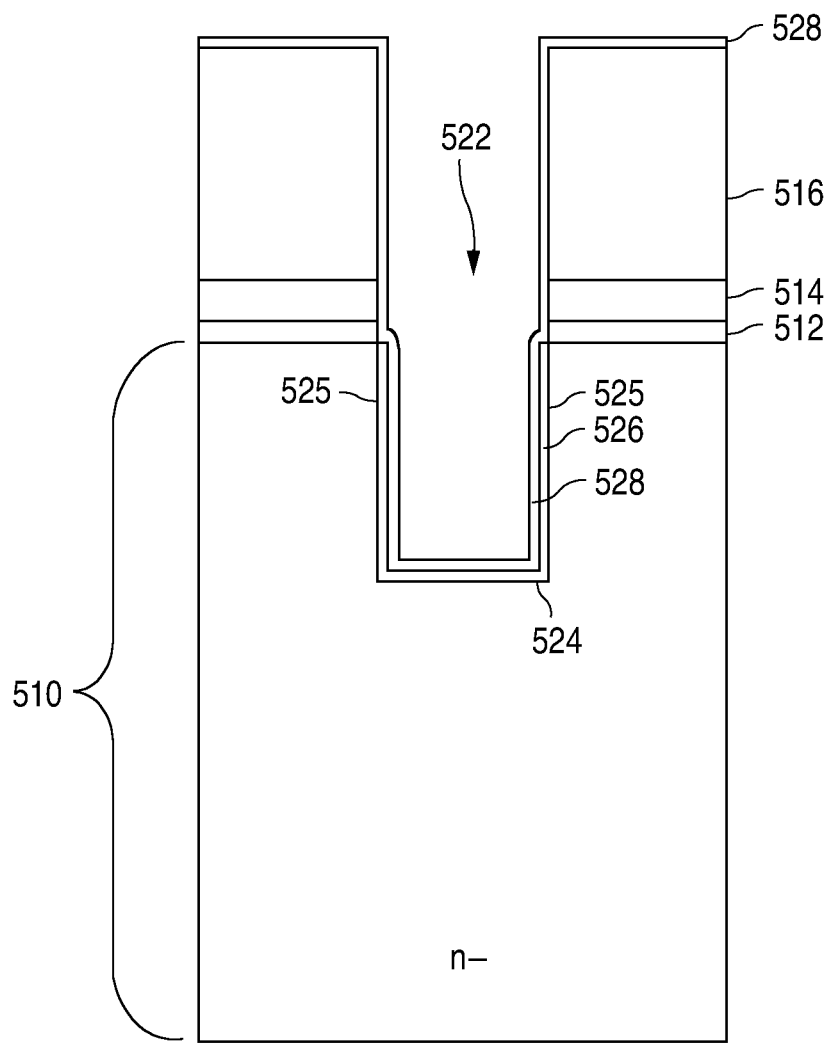
Figure 5E:
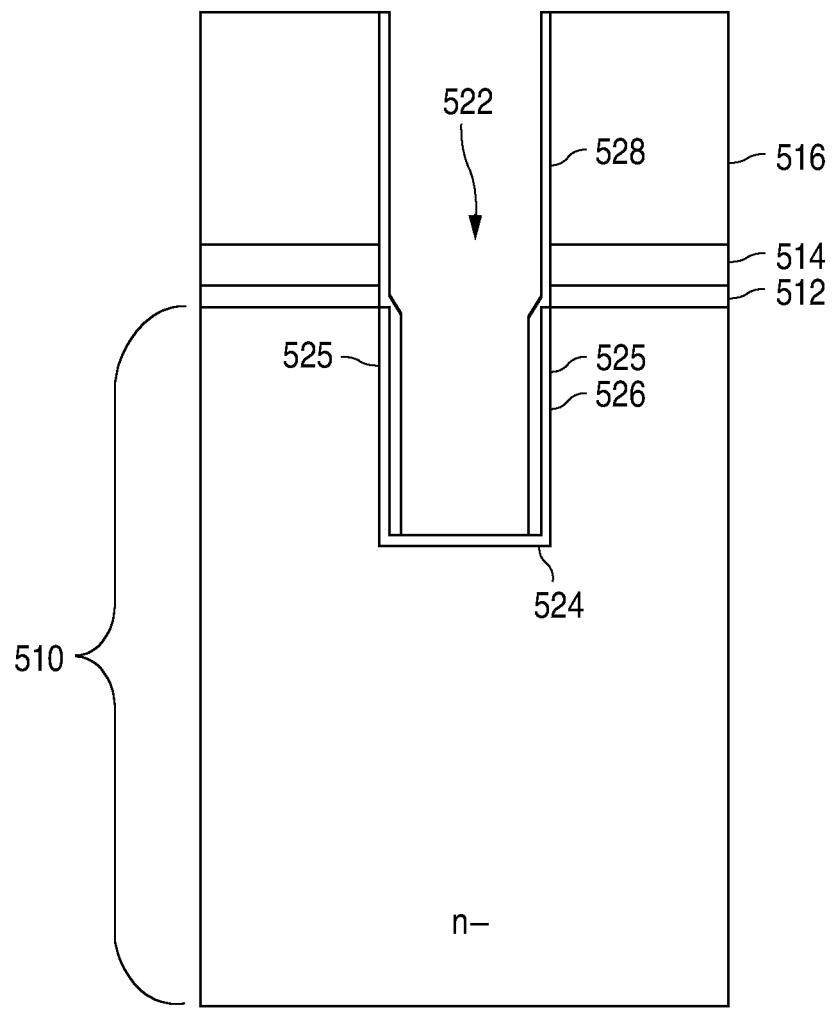
Figure 5F:
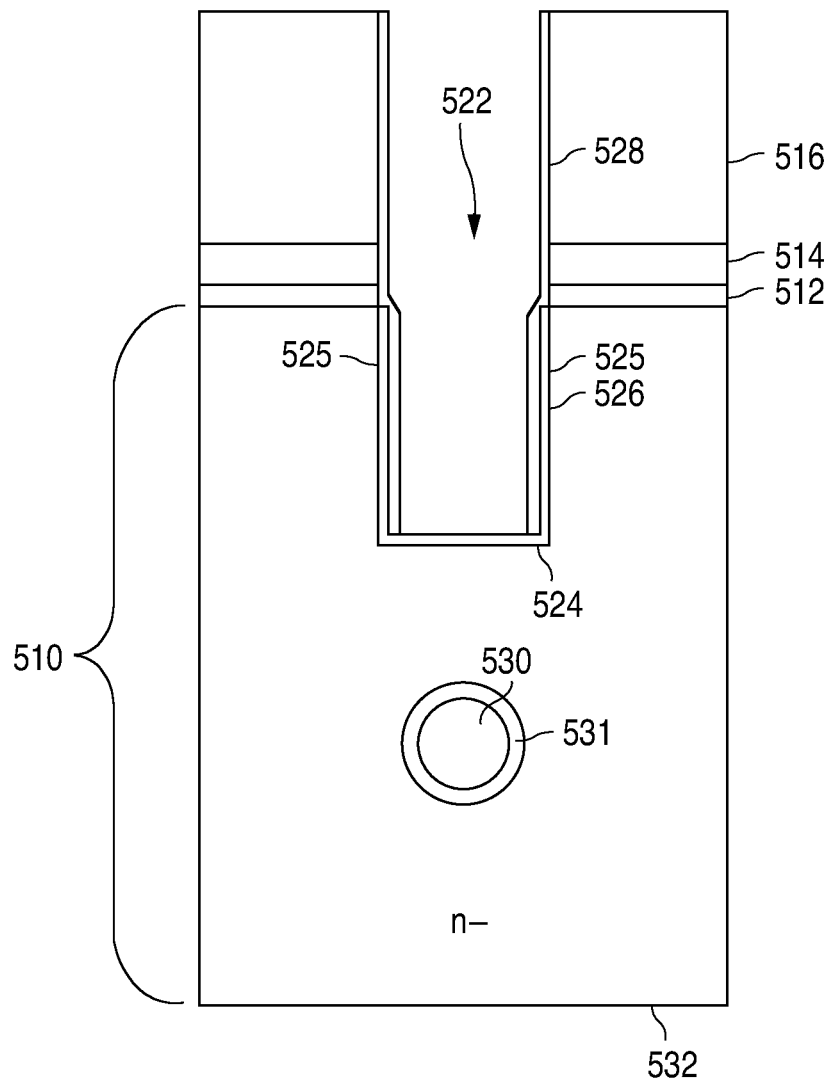
Figure 5G:
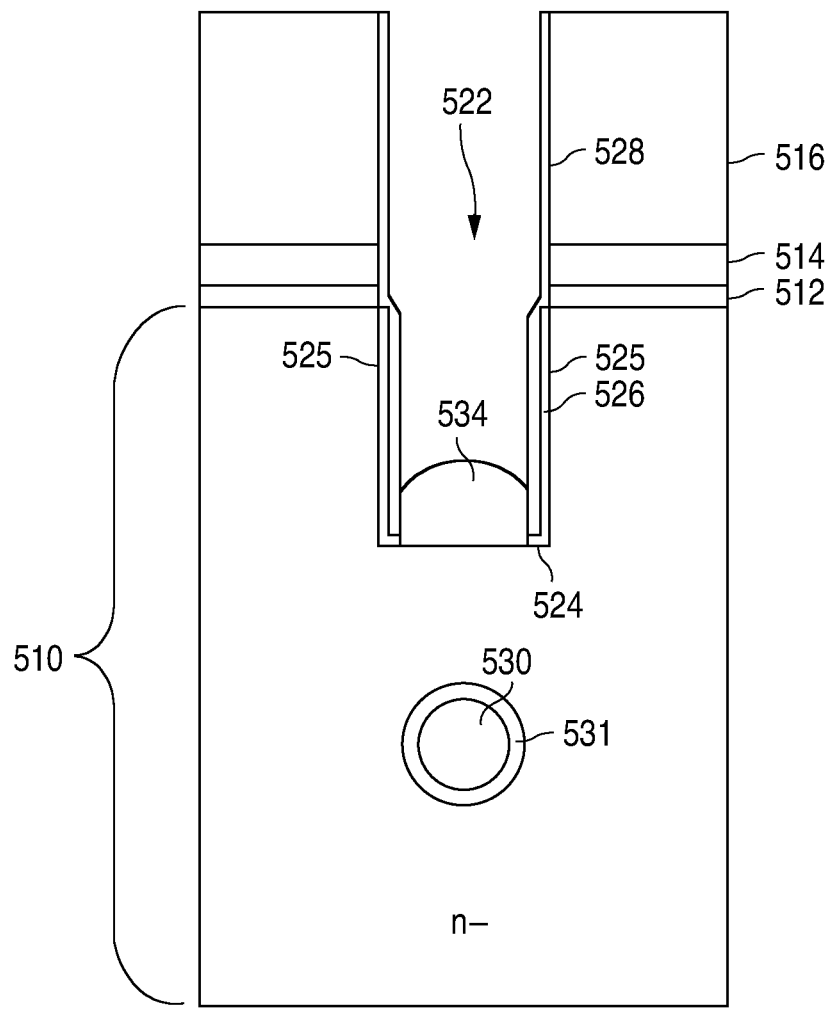
Figure 5H:
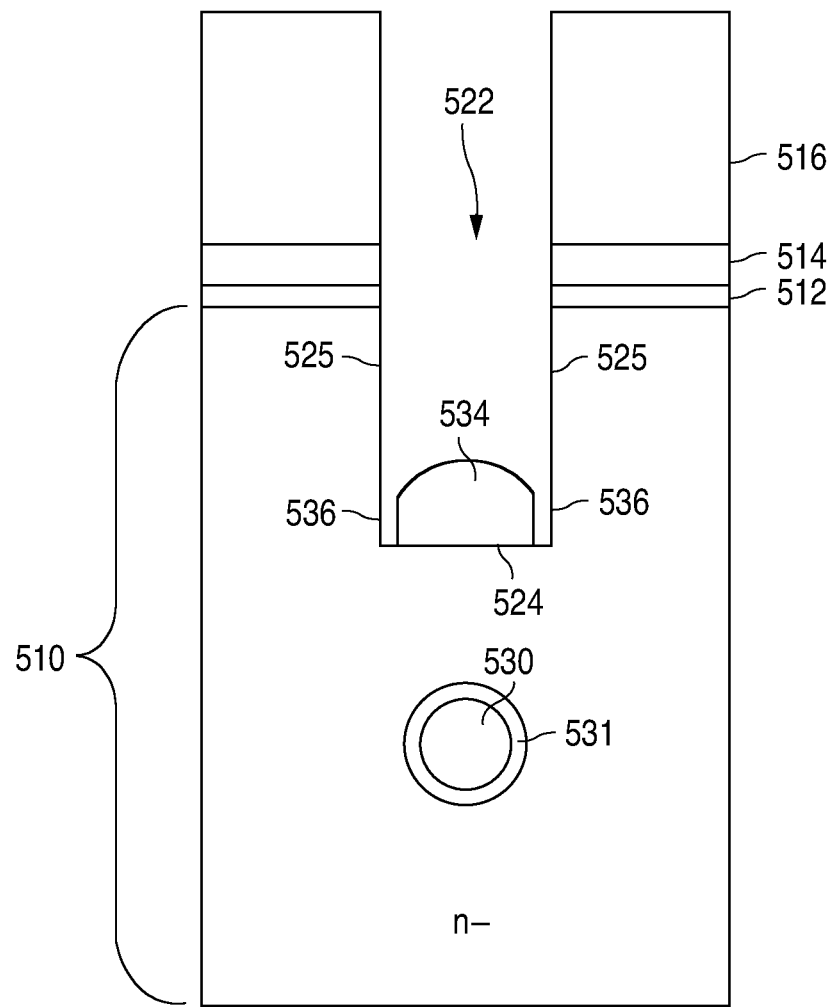
Figure 5I:
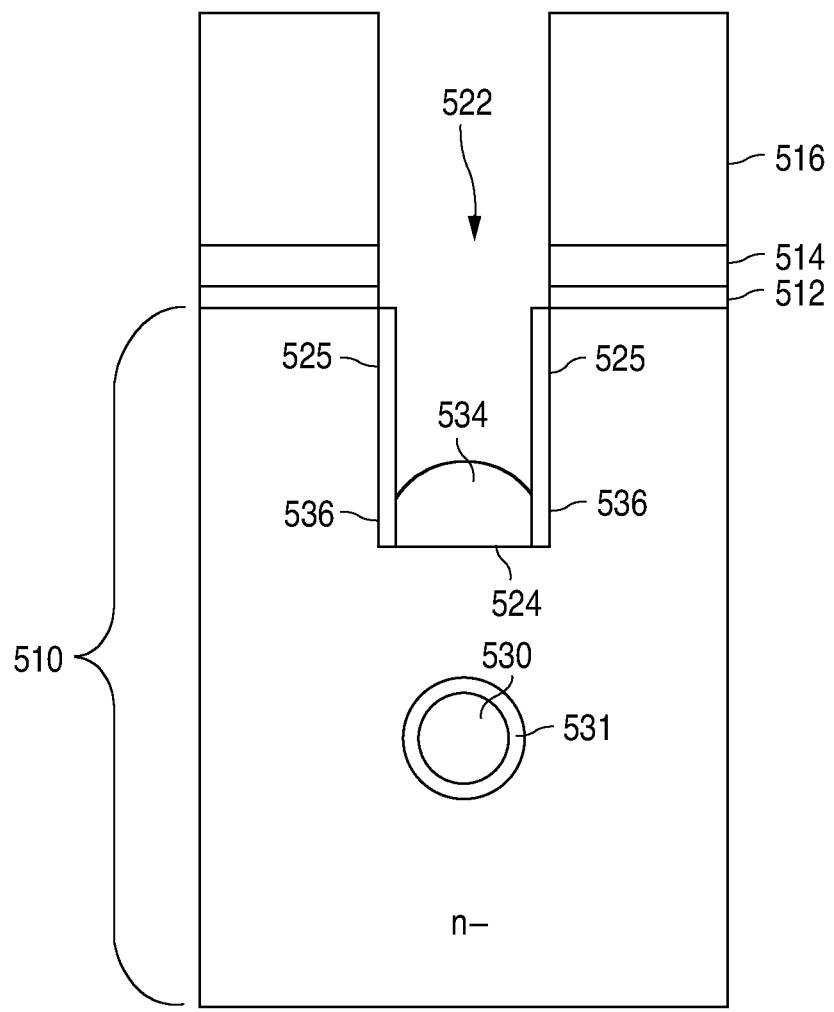
Figure 5J:
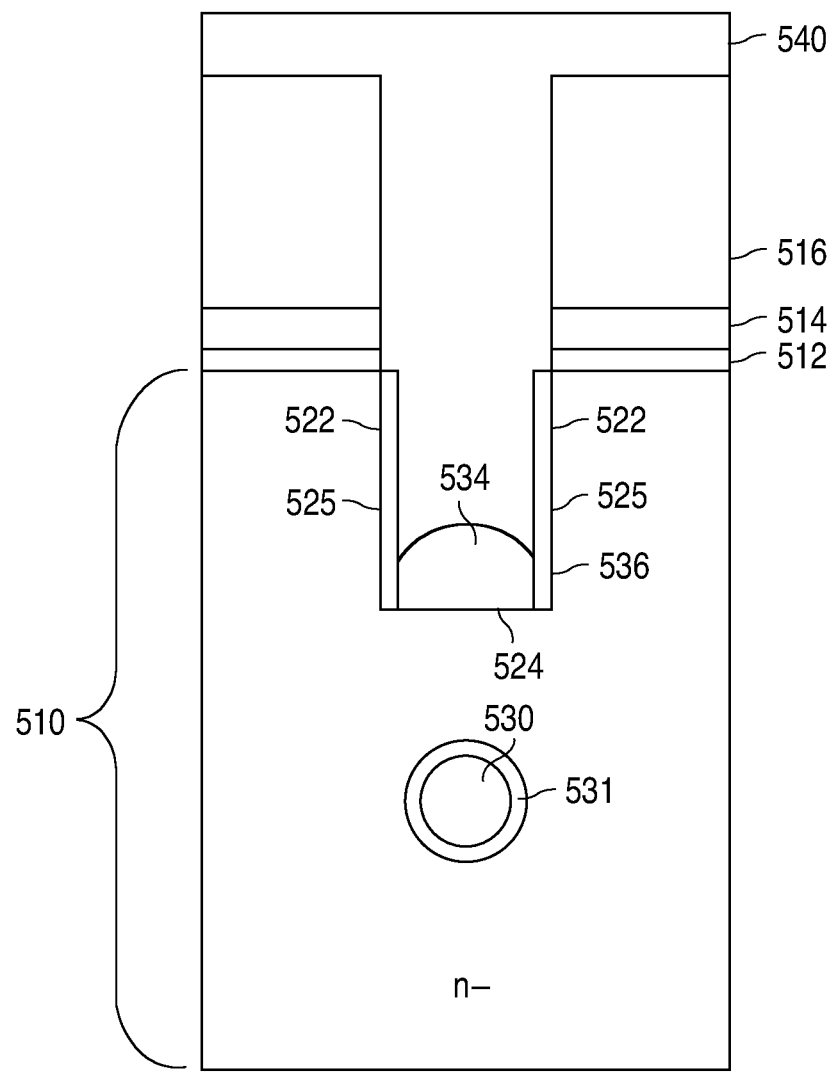
Figure 5K:
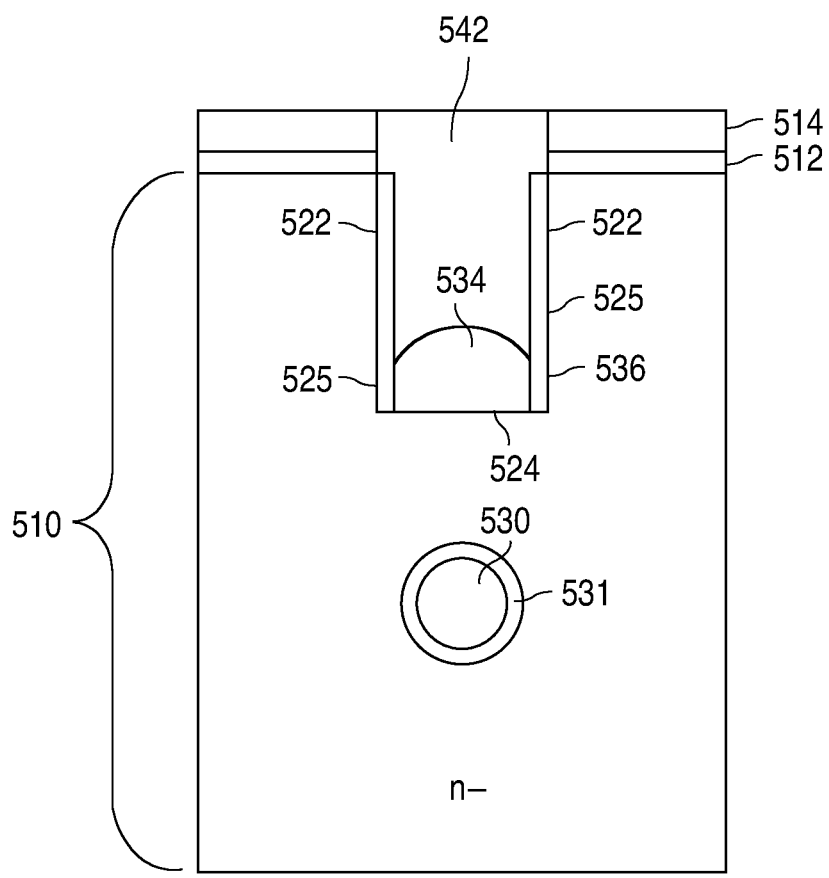
Figure 5L:
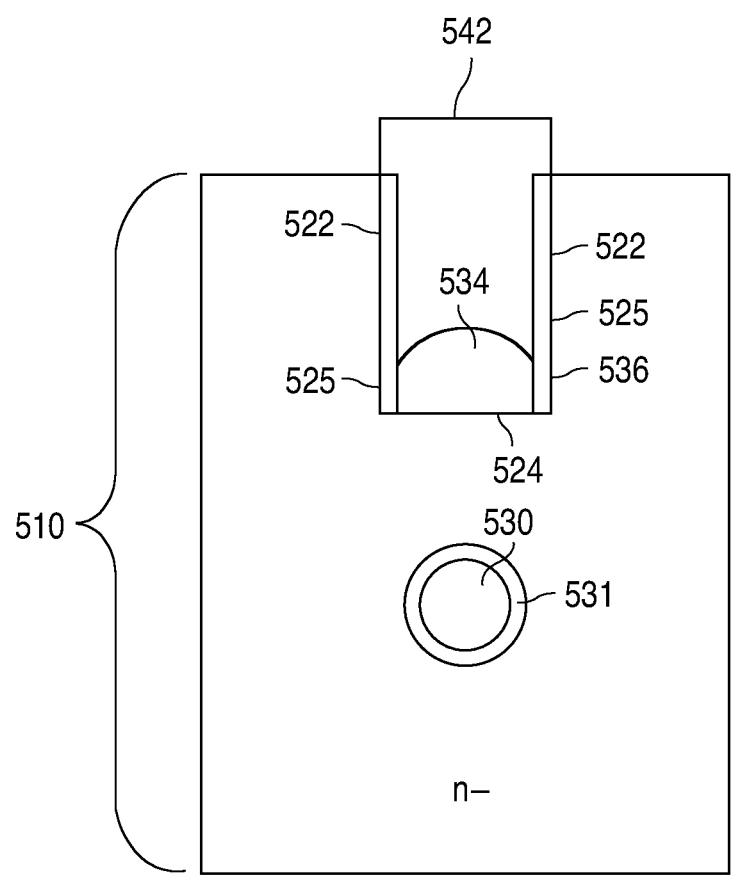
Figure 5M:
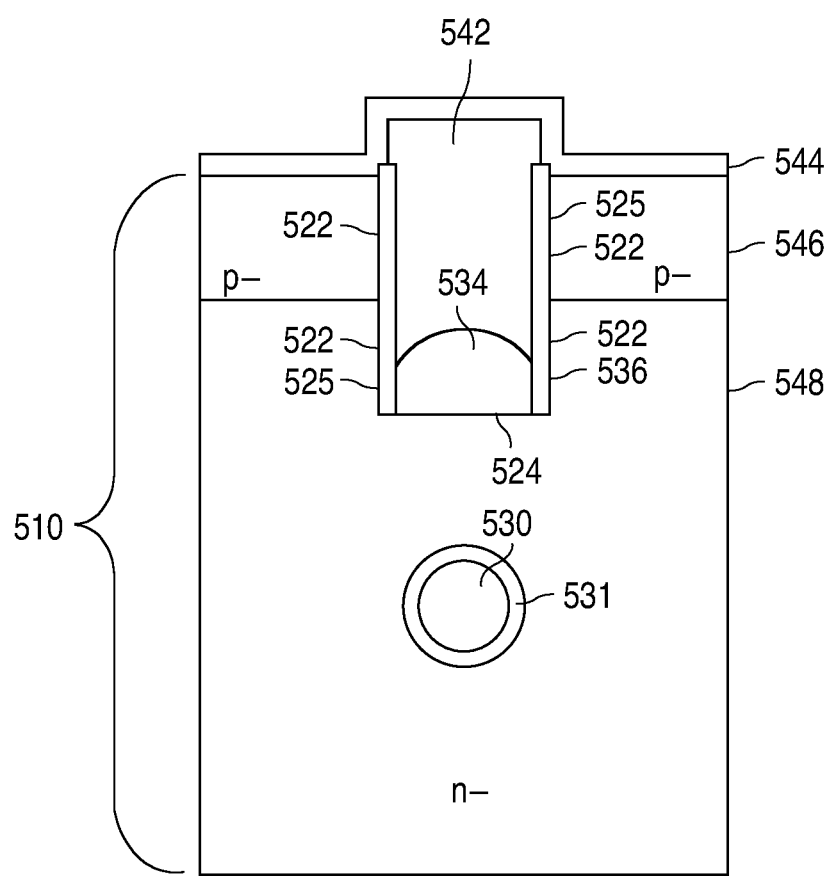
Figure 5N:
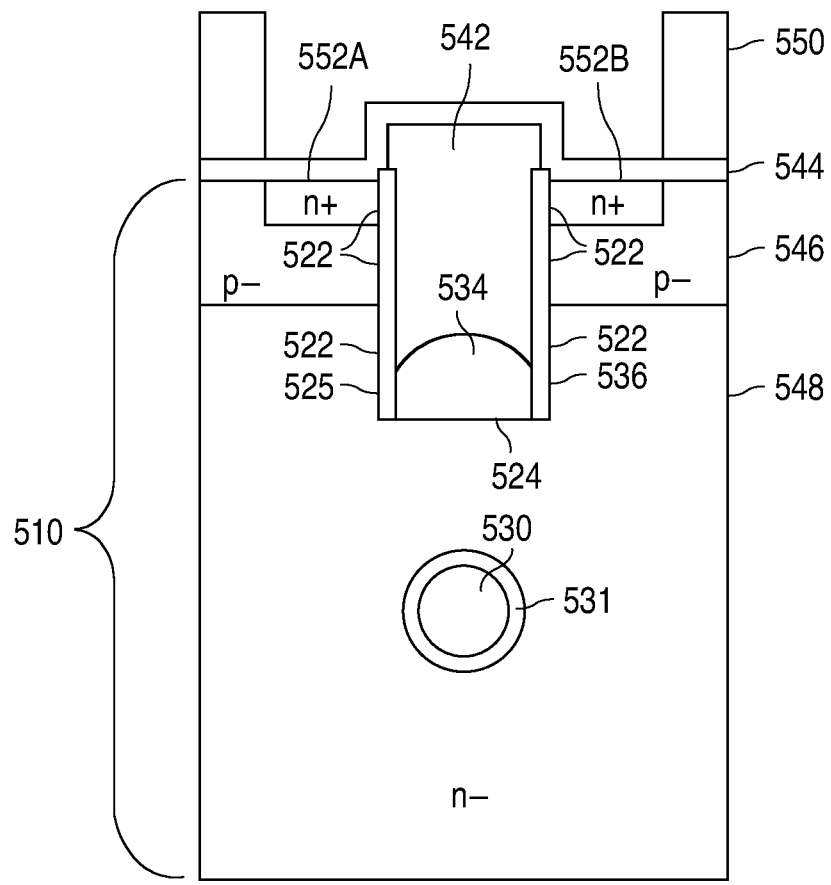
Figure 5O:
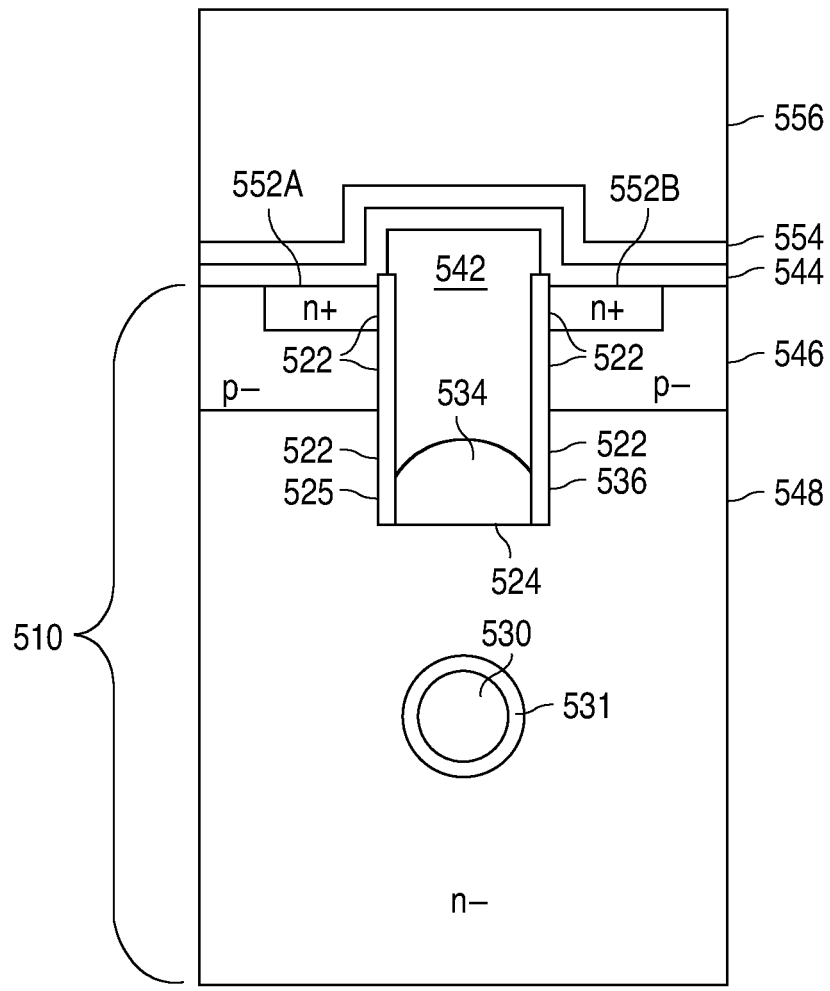
Figure 5P:
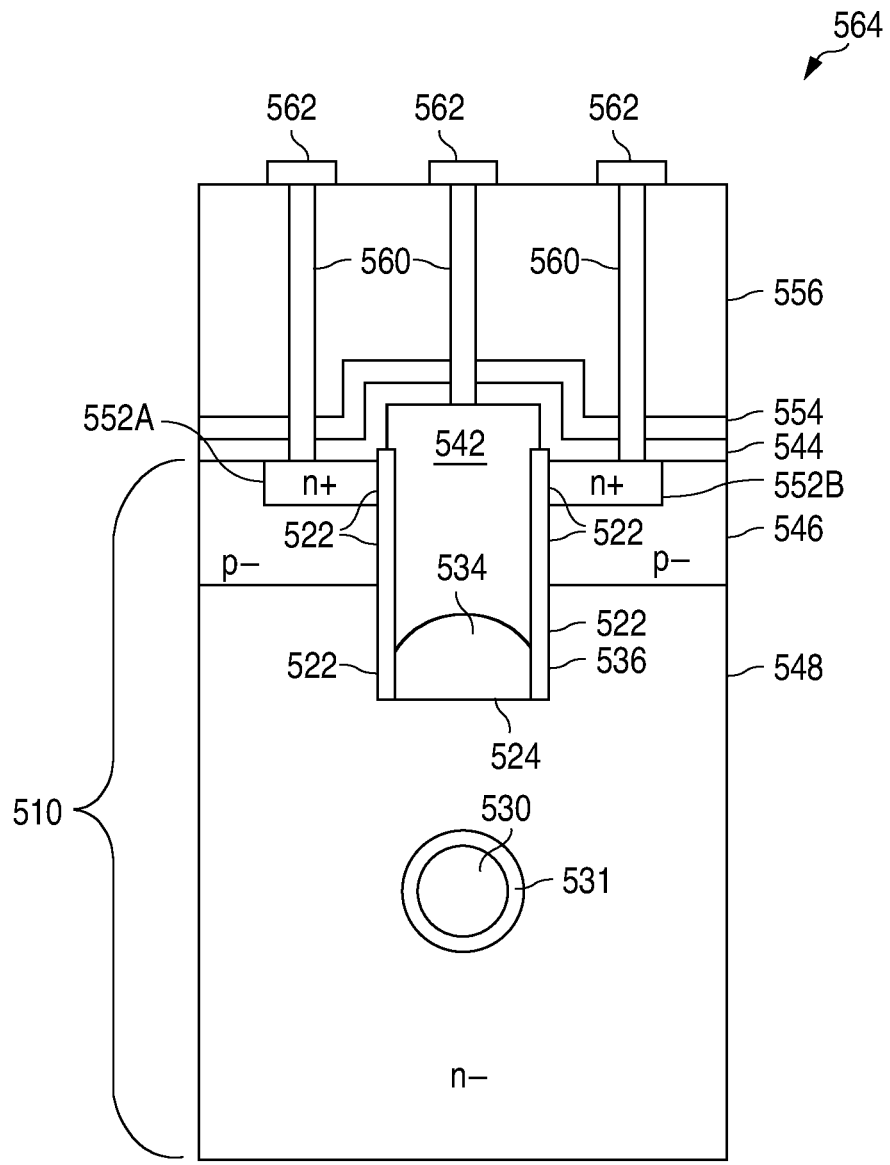

FIGS. 5A-5P show cross-sectional views that illustrate an example of a method of forming a trench DMOS transistor in accordance with the present invention. As shown in FIG. 5A, the method, which utilizes a conventionally-formed n-type semiconductor structure 510, such as a substrate or an epitaxial layer, begins by forming an insulation layer 512 approximately 250 Å thick on the top surface of semiconductor structure 510. Insulation layer 512 can be formed in a conventional manner, such as by the growth of an oxide layer.

After insulation layer 512 has been formed, a non-conductive layer 514 approximately 1850 Å thick is formed on the top surface of insulation layer 512. Non-conductive layer 514 can be formed in a conventional manner, such as by the low-pressure chemical vapor deposition (LPCVD) of a nitride layer.

Once non-conductive layer 514 has been formed, an isolation layer 516 approximately 16.3KÅ thick is formed on the top surface of non-conductive layer 514. Isolation layer 516 can be formed in a conventional manner, such as with the deposition of a layer of undoped silicate glass or oxide. A conventional rapid thermal process is then used to densify the films.

Following this, a patterned photoresist layer 520 is formed on the top surface of isolation layer 516. Patterned photoresist layer 520 can be formed in a conventional manner, which includes depositing a layer of photoresist, and projecting a light through a patterned black/clear glass plate known as a mask to form a patterned image on the layer of photoresist. The light softens the photoresist regions exposed to the light. After this, the softened photoresist regions are removed.

As shown in FIG. 5B, once patterned photoresist layer 520 has been formed, the exposed regions of isolation layer 516 and the underlying regions of non-conductive layer 514 and insulation layer 512 are etched in a conventional manner to expose a region on the surface of semiconductor structure 510, and thereby form a hard mask. Following the etch, patterned photoresist layer 520 is removed in a conventional manner, such as with a plasma ash followed by an HF acid dip.

After patterned photoresist layer 520 has been removed, as shown in FIG. 5C, the exposed region of semiconductor structure 510 is anisotropically dry etched in a conventional manner to form an opening 522 in semiconductor structure 510. Opening 522, which has a bottom surface 524 and a side wall surface 525, can be formed, for example, as a round opening, a square opening, a hexagonal opening, or a trench opening.

As shown in FIG. 5D, following the formation of opening 522, opening 522 is cleaned and an insulation layer 526 approximately 400 Å thick is conformally formed on semiconductor structure 510 to line opening 522. Insulation layer 526 can be formed in a conventional manner, such as by the growth of an oxide layer.

Once insulation layer 526 has been formed, a non-conductive layer 528 approximately 400 Å thick is conformally formed on insulation layer 526 and isolation layer 516 to also line opening 522. Non-conductive layer 528 can be formed in a conventional manner, such as by the deposition of a nitride layer.

Once non-conductive layer 528 has been formed, as shown in FIG. 5E, non-conductive layer 528 is then anisotropically etched in a conventional manner to expose the top surface of isolation layer 516, and a portion of insulation layer 526 that lies over the bottom surface 524 of opening 522.

As shown in FIG. 5F, after the portion of insulation layer 526 that lies over the bottom surface 524 of opening 522 has been exposed, a p-type dopant, such as boron, is implanted in a conventional manner through the bottom surface 524 of opening 522 into n-type semiconductor structure 510. The implanted dopant is then driven in and activated to form a p-type island 530 in n-type semiconductor structure 510. In addition, the formation of a p-type region in an n-type material causes a depletion (space charge) region 531 to be formed that completely surrounds island 530, where n-type semiconductor structure 510 completely surrounds depletion region 531.

As further shown in FIG. 5F, island 530 lies directly vertically below the bottom surface 524 of opening 522, spaced apart from both a bottom surface 532 of semiconductor structure 510 and the bottom surface 524 of opening 522. The implant can be formed with, for example, a dose of $2 \times 10^{11}$ atoms/cm$^3$ and an implant energy of 800 KeV. Island 530 electrically floats in that island 530 is completely surrounded by only n-type semiconductor structure 510. (Multiple implant energies are used when multiple islands are formed as with transistor 400.)

Following the implant that forms island 530, as shown in FIG. 5G, an insulation region 534 approximately 2500 Å thick (+/−250 Å thick) is formed on a portion of the bottom surface 524 of opening 522. For example, the exposed portion of insulation layer 526 that lies over the bottom surface 524 of opening 522 can be further grown using a conventional high-pressure oxidation (HIPDX) process to transform the exposed portion of insulation layer 526 into insulation region 534.

As shown in FIG. 5H, once insulation region 534 has been formed, non-conductive layer 528 is removed in a conventional manner, such as by using hot phosphoric acid with a 100% over etch to remove a nitride layer. The exposed insulation layer 526 is then removed in a conventional manner, such as by using an HF acid dip to remove an oxide layer.

After the exposed insulation layer 526 has been removed, as shown in FIG. 5I, a gate oxide layer 536 approximately 300 Å thick is formed on semiconductor structure 510 to line the side wall 525 of opening 522. For example, gate oxide layer 536 can be grown in a conventional manner (which also causes insulation region 534 to grow in size).

As shown in FIG. 5J, following the formation of gate oxide layer 536, a polysilicon layer 540 is formed to touch isolation layer 516, non-conductive layer 514, isolation layer 512, and gate oxide layer 536 to fill the remainder of opening 522. After this, as shown in FIG. 5K, a portion of polysilicon layer 540, all of isolation layer 516, and a portion of non-conductive layer 514 are removed using either a conventional poly etch back process or poly chemical-mechanical polishing (CMP) process to form a polysilicon gate 542.

Once gate 542 has been formed, gate 542 is doped using, for example, an n-type blanket implant with a dose of $1.79 \times 10^{16}$ atoms/cm$^3$ and an implant energy of 30 KeV. After gate 542 has been doped, as shown in FIG. 5L, non-conductive layer 514 is removed in a conventional manner, followed by the conventional removal of insulation layer 512.

As shown in FIG. 5M, once insulation layer 512 has been removed, an insulation layer 544 is formed on the top surface of semiconductor structure 510 and gate 542. Insulation layer 544 can be formed in a conventional manner, such as by the growth of an oxide layer. Following the formation of insulation layer 544, a p-type dopant is blanket implanted in a conventional manner into the surface of semiconductor structure 510 one or more times at one or more implant energies. For example, a single implant can be formed with a dose of $2.2 \times 10^{13}$ atoms/cm$^3$ and an implant energy of 50 KeV.

The dopant is then driven in and activated in a conventional manner to form a lightly-doped p-body region 546 and an n-type drain region 548 that lies below p-body region 546. (The p-type dopant is also implanted into gate 542. However, the p-type dopant concentration (e.g., $2.2 \times 10^{13}$ atoms/cm$^3$) is much less than the n-type dopant concentration (e.g., $1.79 \times 10^{16}$ atoms/cm$^3$) of gate 542 and, as a result, has no significant effect on the dopant concentration of gate 542.)

After p-body region 546 and n-type drain region 548 have been formed, as shown in FIG. 5N, a patterned photoresist layer 550 is conventionally formed on the top surface of oxide layer 544. Following this, an n-type dopant, such as arsenic, is implanted in a conventional manner into semiconductor structure 510 to form n+ source regions 552A and 552B.

For example, the implant can be formed with a dose of $5 \times 10^{15}$ atoms/cm$^3$ and an implant energy of 80 KeV. Depending on the pattern in layer 550, the n+ source regions 552A and 552B can be either spaced apart or connected to each other as a single n+ region. Patterned photoresist layer 550 is then removed in a conventional manner. A conventional rapid thermal process is used to drive in and activate the n+ source regions 552A and 552B.

As shown in FIG. 5O, once patterned photoresist layer 550 has been removed, a non-conductive layer 554 approximately 500 Å thick is formed on insulation layer 544. Non-conductive layer 554 can be formed in a conventional manner, such as by the plasma enhanced chemical vapor deposition (PECVD) of a nitride layer.

Following this, an isolation layer 556 is formed on the top surface of non-conductive layer 554. Isolation layer 556 can be conventionally formed, such as with a layer of undoped silicate glass (USG) approximately 1KÅ thick, an overlying layer of phosphosilicate glass (PSG) approximately 3KÅ thick, and an overlying layer of tetraethyl orthosilicate (TEOS) approximately 12.5KÅ thick.

Next, as shown in FIG. 5P, contacts 560 are formed through isolation layer 556, non-conductive layer 554, and insulation layer 544 to make electrical connections with poly gate 542 and the n+ source regions 552A and 552B, and metal-1 lines 562 are formed on isolation layer 556 and the contacts 560 to form a trench DMOS transistor 564 through the metal-1 layer. The method then continues with conventional back-end processing steps to form the remainder of the metal interconnect structure.

Once the complete metal interconnect structure has been formed, the bottom surface of semiconductor structure 510 can be back ground as necessary to vary the thickness of drain region 548. After any back grinding, a metal contact can be conventionally formed on bottom surface of semiconductor structure 510 to form transistor 100. With respect to transistor 200, the bottom surface of semiconductor structure 510 can be implanted with an n-type dopant after any back grinding to form n+ region 210, before the metal contact is formed.

With respect to transistor 300, semiconductor structure 510 is an epitaxial layer formed on a carrier substrate with a heavily-doped top surface. Semiconductor structure 510 can be formed as an epitaxial layer on a carrier substrate with a heavily-doped top surface in the same manner that the epitaxial layer of a bipolar transistor is formed on a buried layer formed in the top surface of a carrier substrate. In addition, a sinker region down to the buried layer can be formed in the same manner that a collector sinker region of the bipolar transistor is formed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A trench DMOS structure comprising:
   a semiconductor structure having:
      a drain region of a first conductivity type, having a bottom surface;
      a body region of a second conductivity type that touches the drain region;
      an opening that extends through the body region into the drain region, the opening having a bottom surface and a side wall surface;
      a source region of the first conductivity type that touches the body region and the side wall surface of the opening, the drain region and the source region being spaced apart and vertically separated by the body region along the side wall surface;
      a gate oxide layer within the opening, the gate oxide touching the drain region, the source region and the body region to line the side wall surface of the opening;
      a gate that touches the gate oxide layer, the gate being conductive and lying within the opening;
      a first island of the second conductivity type formed within the drain region that lies directly vertically between and spaced apart from the bottom surface of the drain region and the gate; and
      a first doped region of the second conductivity type that touches and completely surrounds the first island, the drain region touching and completely surrounding the first doped region including between the first doped region and the opening.

2. The trench DMOS structure of claim 1, further comprising an insulation region that touches and covers the bottom of the opening and touches and lies below the gate.

3. The trench DMOS structure of claim 1, further comprising:
   a second island of the second conductivity type formed within the drain region that lies between and spaced apart from the bottom surface of the drain region and the first island, the first and second islands being vertically aligned; and
   a second doped region of the second conductivity type that touches and completely surrounds the second island, the drain region touching and completely surrounding the second doped region.

4. The trench DMOS structure of claim 1, wherein the first conductivity type is n-type and the second conductivity type is p-type.

5. A trench DMOS structure comprising:
   an n-type drain region having a bottom surface disposed in a semiconductor structure;
   a p-type body region that touches the n-type drain region;
   a trench that extends through the p-type body region into the n-type drain region, the trench having a bottom surface and a side wall surface;
   an n-type source region that touches the p-type body region and the side wall surface of the trench, the n-type drain region and the n-type source region being spaced apart and vertically separated by the p-type body region along the side wall surface;
   a gate within the trench;
   a gate oxide layer within the trench, the gate oxide laterally separating the gate from the n-type drain region, the n-type source region and the p-type body region to line the side wall surface of the trench;

a first island of p-type material formed within the n-type drain region that lies directly vertically between and spaced apart from the bottom surface of the n-type drain region and the gate; and a first p-type region that touches and completely surrounds the first island, the drain region touching and completely surrounding the first p-type region including between the first p-type region and the trench.

6. The trench DMOS structure of claim 5, further comprising an insulation region that touches and covers the bottom of the trench and touches and lies below the gate.

7. The trench DMOS structure of claim 5, further comprising:
   a second island of p-type material formed within the n-type drain region that lies between and spaced apart from the bottom surface of the n-type drain region and the first island, the first and second islands being vertically aligned; and
   a second p-type region that touches and completely surrounds the second island, the n-type drain region touching and completely surrounding the second p-type region.

8. The trench DMOS structure of claim 5, wherein a distance from a top of the first p-type region to the bottom surface of the trench is less than a width of the trench.

9. The trench DMOS structure of claim 5, further comprising:
   a buried n-type region connected to the bottom surface of the n-type drain region; and
   a sinker region that extends from a top surface of the semiconductor structure to the buried region, wherein the sinker region is n-type.

10. The trench DMOS structure of claim 9, further comprising:
    a first metal contact that extends through an isolation structure to contact the gate;
    a second metal contact that extends through the isolation structure to contact the n-type source region; and
    a third metal contact that extends through the isolation structure to contact the sinker region.

11. A trench DMOS structure comprising:
    a semiconductor structure having:
      an n-type drain region having a bottom surface;
      a p-type body region that touches the drain region;
      a trench that extends through the body region into the drain region, the trench having a bottom surface and a side wall surface;
      an n-type source region that touches the body region and the side wall surface of the trench, the drain region and the source region being spaced apart and vertically separated by the body region along the side wall surface;
      a gate within the trench;
      a gate oxide layer within the trench, the gate oxide laterally separating the gate from the n-type drain region, the n-type source region and the p-type body region to line the side wall surface of the trench; and
      a first island of p-type material formed within the n-type drain region that lies directly vertically between and spaced apart from the bottom surface of the n-type drain region and the gate, wherein a portion of the n-type drain region is located between the first island and the trench, and wherein the first island is located below a center of the trench.

12. The trench DMOS structure of claim 11, further comprising an insulation region that touches and covers the bottom of the trench and touches and lies below the gate.

13. The trench DMOS structure of claim 11, further comprising a second island of p-type material formed within the n-type drain region that lies between and spaced apart from the bottom surface of the n-type drain region and the first island, the first and second islands being vertically aligned.

14. The trench DMOS structure of claim 11, further comprising:
    a buried n-type region connected to the bottom surface of the n-type drain region; and
    a sinker region that extends from a top surface of the semiconductor structure to the buried region, wherein the sinker region is n-type.

15. The trench DMOS structure of claim 14, further comprising:
    a first metal contact that extends through an isolation structure to contact the gate;
    a second metal contact that extends through the isolation structure to contact the n-type source region; and
    a third metal contact that extends through the isolation structure to contact the sinker region.

* * * * *